(12) United States Patent
Zheng et al.

(10) Patent No.: US 9,502,858 B2
(45) Date of Patent: Nov. 22, 2016

(54) LASER ARRAY MUX ASSEMBLY WITH EXTERNAL REFLECTOR FOR PROVIDING A SELECTED WAVELENGTH OR MULTIPLEXED WAVELENGTHS

(75) Inventors: Jun Zheng, Missouri City, TX (US); Stefan J. Murry, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 905 days.

(21) Appl. No.: 13/357,130

(22) Filed: Jan. 24, 2012

(65) Prior Publication Data

US 2013/0016977 A1   Jan. 17, 2013

Related U.S. Application Data

(60) Provisional application No. 61/508,017, filed on Jul. 14, 2011.

(51) Int. Cl.
*H04J 14/02* (2006.01)
*H01S 5/026* (2006.01)
(Continued)

(52) U.S. Cl.
CPC ............. *H01S 5/0268* (2013.01); *H01S 5/141* (2013.01); *H01S 5/4062* (2013.01);
(Continued)

(58) Field of Classification Search
CPC .................. H04S 5/0656; H04S 5/4087; H04S 5/141; H04S 5/4062; H04B 10/506
(Continued)

(56) References Cited

U.S. PATENT DOCUMENTS 5,790,287 A    8/1998  Darcie et al.
5,946,331 A    8/1999  Amersfoort et al.
(Continued)

FOREIGN PATENT DOCUMENTS

EP     2337240 A1     6/2011
WO     2006116477 A2  11/2006
WO     2013010166 A1  1/2013

OTHER PUBLICATIONS

PCT International Search Report and Written Opinion dated Oct. 5, 2012 received in related PCT Application No. PCT/US2012/046902, 9 pgs.
(Continued)

*Primary Examiner* — David Payne
*Assistant Examiner* — Tanya Motsinger
(74) *Attorney, Agent, or Firm* — Grossman Tucker Perreault & Pfleger, PLLC; Norman S. Kinsella

(57) ABSTRACT

A laser array mux assembly generally includes an array of laser emitters coupled to an optical multiplexer, such as an arrayed waveguide grating (AWG), with an external partial reflector after the multiplexer. Each of the laser emitters may include a gain region that emits light across a range of wavelengths including, for example, channel wavelengths in an optical communication system. The AWG filters the emitted light from each of the laser emitters at different channel wavelengths associated with each of the laser emitters. The reflector reflects at least a portion of the filtered light such that lasing occurs at the channel wavelengths of the reflected light. The laser array mux assembly may be used to generate an optical signal at a selected channel wavelength or to generate and combine optical signals at multiple channel wavelengths.

20 Claims, 4 Drawing Sheets

(51) Int. Cl.
    *H01S 5/40*    (2006.01)
    *H01S 5/10*    (2006.01)
    *H01S 5/14*    (2006.01)
    *H04B 10/2587* (2013.01)

(52) U.S. Cl.
    CPC ............ *H01S 5/4087* (2013.01); *H01S 5/1028* (2013.01); *H01S 5/146* (2013.01); *H04B 10/2587* (2013.01); *H04J 14/0282* (2013.01)

(58) Field of Classification Search
    USPC .......................................... 398/43; 372/50.12
    See application file for complete search history.

(56) References Cited

U.S. PATENT DOCUMENTS

| | | |
|---|---|---|
| 6,091,743 A | 7/2000 | Yang |
| 6,295,308 B1 | 9/2001 | Zah |
| 6,529,542 B1 | 3/2003 | Karlsen et al. |
| 6,661,814 B1 | 12/2003 | Chapman et al. |
| 7,123,406 B2 | 10/2006 | Shin et al. |
| 7,313,157 B2 | 12/2007 | Sorin et al. |
| 7,965,949 B1 | 6/2011 | Wach |
| 8,422,124 B2 | 4/2013 | Lee et al. |
| 8,559,821 B2 | 10/2013 | Wen et al. |
| 8,606,107 B2 | 12/2013 | Bai et al. |
| 9,214,790 B2* | 12/2015 | Zheng .................. H01S 5/4062 |
| 2001/0017960 A1 | 8/2001 | Terahara |
| 2002/0154661 A1 | 10/2002 | Hoose et al. |
| 2004/0033004 A1* | 2/2004 | Welch .................... B82Y 20/00 385/14 |
| 2004/0067059 A1* | 4/2004 | Song et al. ........................ 398/82 |
| 2004/0076199 A1 | 4/2004 | Wipiejewski et al. |
| 2005/0036180 A1* | 2/2005 | Petersen ................ G02B 5/203 359/15 |
| 2005/0078359 A1 | 4/2005 | Kim et al. |
| 2005/0135449 A1* | 6/2005 | Sorin .................. H04B 10/506 372/50.1 |
| 2005/0185262 A1 | 8/2005 | Yun et al. |
| 2005/0213618 A1 | 9/2005 | Sochava et al. |
| 2006/0115271 A1 | 6/2006 | Hwang et al. |
| 2006/0171428 A1 | 8/2006 | Volodin |
| 2006/0215713 A1 | 9/2006 | Flanders et al. |
| 2006/0256831 A1* | 11/2006 | Volodin ............. G02B 27/0944 372/102 |
| 2007/0019901 A1* | 1/2007 | Kish ...................... B82Y 20/00 385/14 |
| 2007/0047608 A1* | 3/2007 | Volodin et al. ............ 372/50.12 |
| 2007/0133647 A1 | 6/2007 | Daiber |
| 2007/0223552 A1 | 9/2007 | Muendel et al. |
| 2008/0259972 A1 | 10/2008 | Heanue et al. |
| 2008/0267246 A1 | 10/2008 | Volodin et al. |
| 2009/0074019 A1* | 3/2009 | Wong ...................... H01S 5/183 372/26 |
| 2009/0154939 A1* | 6/2009 | Kim .................... H04J 14/0282 398/168 |
| 2009/0245799 A1 | 10/2009 | Habel et al. |
| 2010/0014865 A1* | 1/2010 | Sorin .................. H04B 10/506 398/79 |
| 2010/0266283 A1 | 10/2010 | Beckett |
| 2010/0316378 A1* | 12/2010 | Yeh ....................... H01S 5/4062 398/58 |
| 2011/0033192 A1 | 2/2011 | Daiber et al. |
| 2011/0038635 A1* | 2/2011 | Bai ....................... H01S 5/0656 398/82 |
| 2011/0129227 A1* | 6/2011 | Wen ...................... H01S 5/0687 398/82 |
| 2011/0135309 A1* | 6/2011 | Lee .................... H04B 10/2587 398/79 |
| 2011/0158651 A1* | 6/2011 | Tang ..................... H01S 5/0687 398/98 |
| 2011/0216789 A1* | 9/2011 | Docter et al. .................... 372/20 |
| 2011/0222855 A1 | 9/2011 | Kim et al. |
| 2011/0310917 A1* | 12/2011 | Krishnamoorthy . H01S 5/06821 372/23 |
| 2012/0087667 A1 | 4/2012 | Bulthuis |
| 2012/0141128 A1* | 6/2012 | Bai ....................... H04B 10/506 398/65 |
| 2012/0269516 A1* | 10/2012 | Liu ..................... H04B 10/2503 398/72 |
| 2013/0089322 A1 | 4/2013 | Ohlen |
| 2014/0064733 A1* | 3/2014 | Liu ..................... H04B 10/506 398/79 |
| 2014/0161144 A1* | 6/2014 | Xu .......................... H01S 5/141 372/6 |

OTHER PUBLICATIONS

PCT International Search Report and Written Opinion dated Oct. 22, 2012 received in corresponding PCT Application No. PCT/US2012/046912, 8 pgs.

Lee, San-Liang et al, "Trend and Applications of Tunable Semiconductor Lasers", Optoelectronic Materials and Devices II, Proc. of SPIE vol. 6782, 67821H, 2007, Taipei, Taiwan R.O.C., 10 pgs.

PCT International Search Report and Written Opinion dated Dec. 30, 2013 received in related PCT Application No. PCT/US2013/063213, 8 pgs.

US Office Action mailed Feb. 10, 2014, received in related U.S. Appl. No. 13/359,847, 16 pgs.

US Office Action mailed Apr. 1, 2014, received in related U.S. Appl. No. 13/644,113, 20 pgs.

US Office Action mailed Apr. 24, 2014, received in related U.S. Appl. No. 13/539,961, 31 pgs.

US Office Action mailed Aug. 9, 2013, received in related U.S. Appl. No. 13/359,847, 15 pgs.

US Office Action mailed Oct. 22, 2014, received in related U.S. Appl. No. 13/644,113, 23 pgs.

US Office Action mailed Aug. 15, 2014, received in related U.S. Appl. No. 13/539,961, 16 pgs.

Harvey, K.C. and Myatt, C.J., "External-cavity diode laser using a grazing-incidence diffraction grating", Optics Letters, vol. 16, No. 12, Dallas, Texas, Jun. 15, 1991, pp. 910-912.

English language European Extended Search Report dated Jun. 23, 2015, received in related EPO Application No. 12811021.0, 6 pgs.

English language European Extended Search Report dated Mar. 13, 2015, received in related EPO Application No. 12811401.4, 8 pgs.

English language Extended EPO Search Report issued May 20, 2016, received in related EPO Application No. 13843383.4, 8 pgs.

\* cited by examiner

LASER ARRAY MUX ASSEMBLY WITH EXTERNAL REFLECTOR FOR PROVIDING A SELECTED WAVELENGTH OR MULTIPLEXED WAVELENGTHS

CROSS-REFERENCE TO RELATED APPLICATIONS

The present application claims the benefit of U.S. Provisional Patent Application Ser. No. 61/508,017 filed on Jul. 14, 2011, which is fully incorporated herein by reference.

TECHNICAL FIELD

The present disclosure relates to wavelength division multiplexed (WDM) optical systems, networks, and methods and more particularly, to a laser array mux assembly with an external reflector for providing a selected wavelength or multiplexed wavelengths.

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

A laser array mux assembly, consistent with embodiments described herein, generally includes an array of laser emitters coupled to an optical multiplexer, such as an arrayed waveguide grating (AWG), with an external partial reflector after the optical multiplexer. Each of the laser emitters may include a gain region that emits light across a plurality of wavelengths including, for example, channel wavelengths in an optical communication system. The AWG or optical multiplexer filters the emitted light from each of the laser emitters at different channel wavelengths associated with each of the laser emitters. The external partial reflector reflects at least a portion of the filtered light such that lasing occurs at the channel wavelength(s) of the reflected, filtered light. The laser array mux assembly may be used, for example, in a tunable transmitter, to generate an optical signal at a selected channel wavelength. The laser array mux assembly may also be used in a multiplexing optical transmitter to generate and combine optical signals at multiple different channel wavelengths.

The laser array mux assembly with an external reflector may be used in optical transmitters in a wavelength division multiplexed (WDM) optical system. A wavelength-selectable laser mux assembly may be used, for example, in a tunable transmitter or transceiver in a WDM system such as an optical networking terminal (ONT) or optical networking unit (ONU) in a WDM passive optical network (PON) to select the appropriate transmission channel wavelength for the ONT/ONU. A multiplexing laser array mux assembly may be used, for example, in an optical line terminal (OLT) in a WDM-PON to combine multiple optical signals at different channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like by which signals carried by one system element are imparted to the "coupled" element and "optically coupled" refers to coupling such that light from one element is imparted to another element. Such "coupled" devices are not necessarily directly connected to one another and may be separated by intermediate components or devices that may manipulate or modify such signals.

Figure 1:
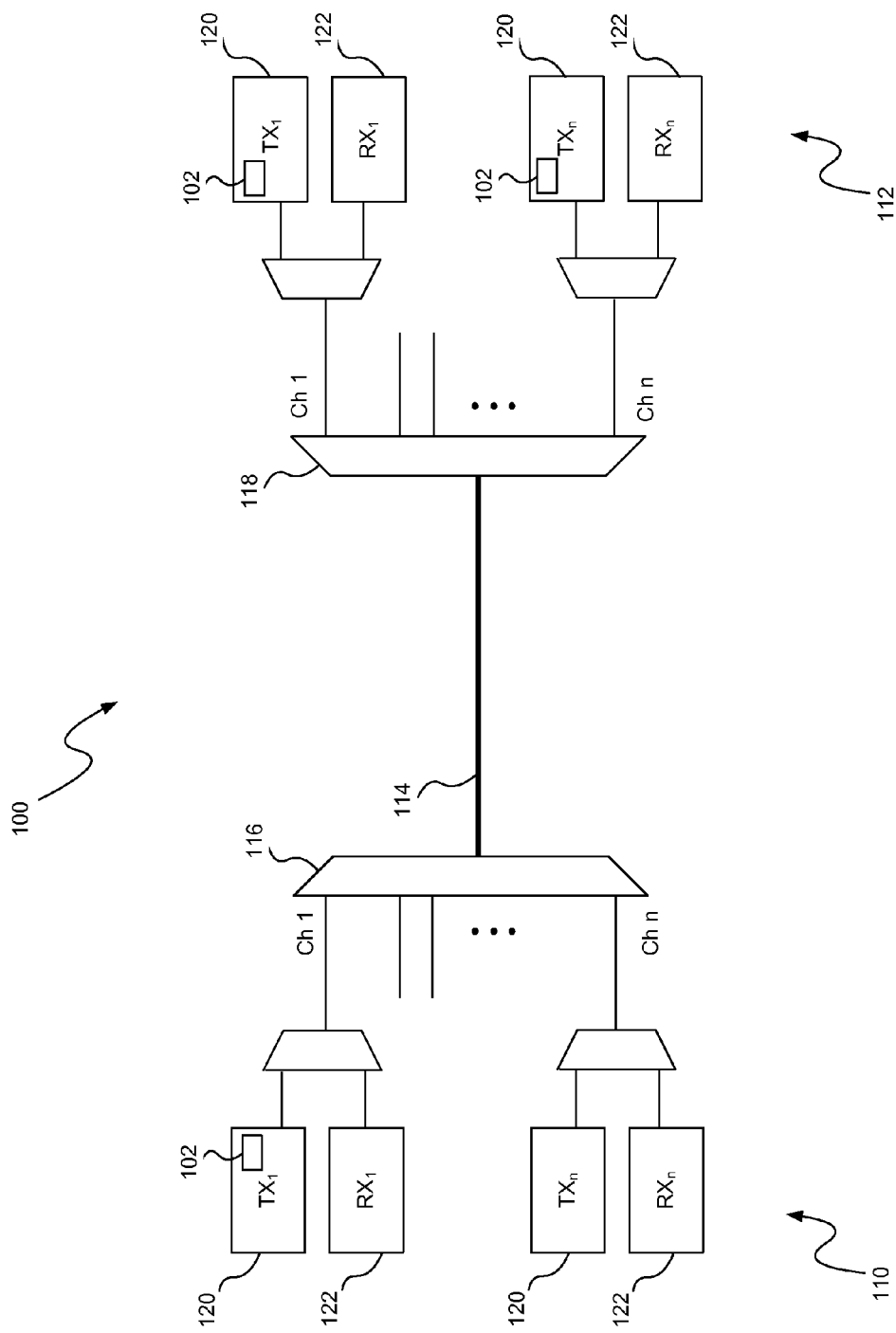
FIG. 1 is a functional block diagram of a wavelength division multiplexed (WDM) optical communication system including one or more laser array mux assemblies, consistent with an embodiment of the present disclosure.

Referring to FIG. 1, a WDM optical communication system 100 including one or more laser array mux assemblies 102, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $TX_1$ to $TX_n$) and receivers 122 (e.g., $RX_1$ to $RX_n$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114. One or more of the transmitters 120 may be tunable transmitters capable of being tuned to the appropriate channel wavelength using a wavelength-selectable laser array mux assembly 102. Thus, the transmitters 120 may be constructed as universal, tunable transmitters capable of being used in different locations in the WDM system 100 and tuned to the appropriate channel wavelength depending upon the location in the WDM system 100.

Figure 2:
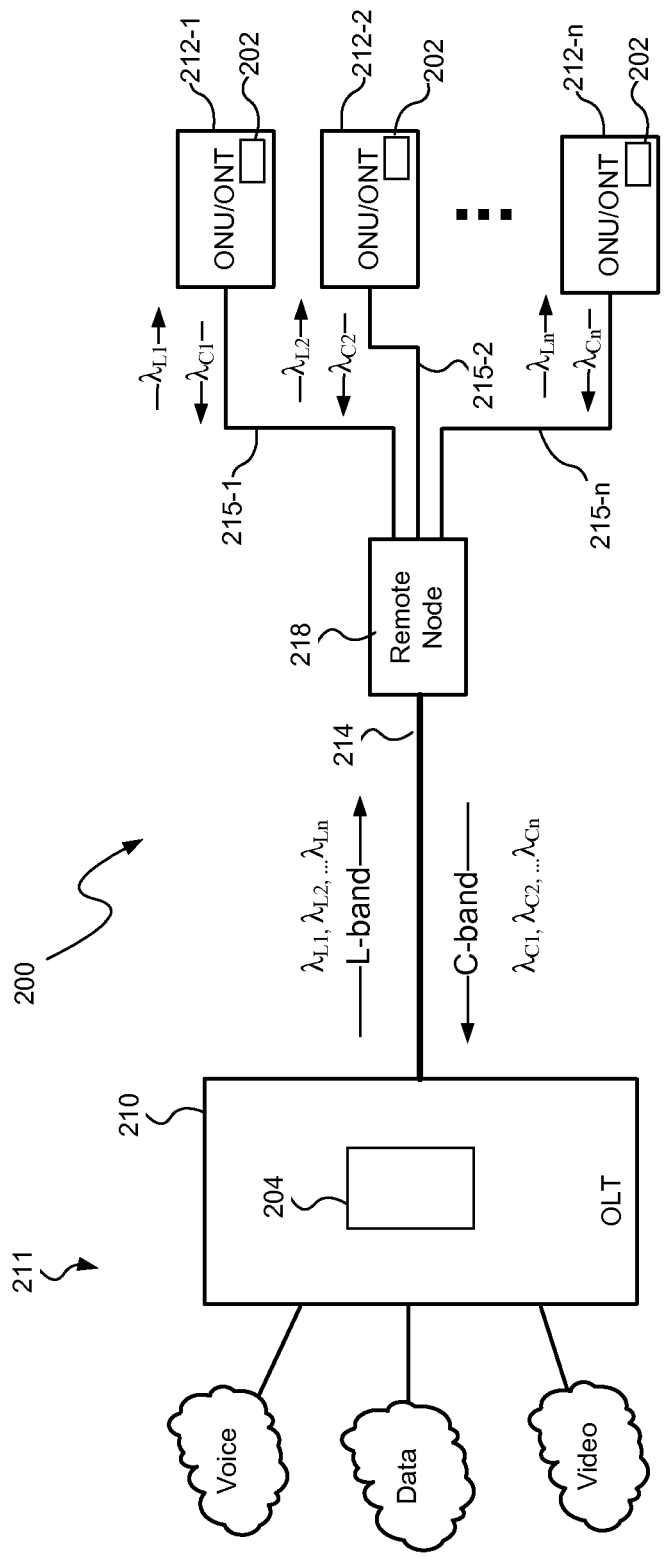
FIG. 2 is a functional block diagram of a wavelength division multiplexed (WDM) passive optical network (PON) including an optical line terminal (OLT) and optical networking terminals (ONTs) with one or more laser array mux assemblies, consistent with embodiments of the present disclosure.

Referring to FIG. 2, one or more laser array mux assemblies 202, 204, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, a central office (CO) 211 including one or more optical line terminals (OLTs) 210 may be coupled to a plurality of optical networking terminals (ONTs) or optical networking units (ONUs) 212-1 to 212-n via optical fibers, waveguides, and/or paths 214, 215-1 to 215-n. A branching point 218 couples the trunk optical path 214 to the separate optical paths 215-1 to 215-n to the ONUs/ONTs 212-1 to 212-n at the subscriber locations. The branching point 218 may include one or more passive coupling devices such as a splitter or optical multiplexer/demultiplexer. The ONUs/ONTs 212-1 to 212-n may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 218 and ONUs/ONTs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the CO 211 may be coupled to one or more sources or networks providing the voice, data and/or video.

In the WDM-PON 200, different ONUs/ONTs 212-1 to 212-n may be assigned different channel wavelengths and optical signals may be transmitted on the different channel wavelengths and combined and separated using WDM techniques. One or more of the ONUs/ONTs 212-1 to 212-*n* may thus include a wavelength-selectable laser array mux assembly 202 for generating an optical signal at a selected channel wavelength assigned for transmission. The OLT 210 may be configured to generate multiple optical signals at different channel wavelengths and to combine the optical signals into an aggregate WDM optical signal carried on the trunk optical fiber or path 214. The OLT 210 may thus include a multiplexing laser array mux assembly 204 for generating and combining the optical signals at multiple channel wavelengths.

In one embodiment, the WDM-PON 200 may use different wavelength bands for transmission of downstream and upstream optical signals relative to the OLT 210. For example, the L-band (e.g., about 1565 to 1625 nm) may be used for downstream transmissions and the C-band (e.g., about 1530 to 1565 nm) may be used for upstream transmissions. The ONUs/ONTs 212-1 to 212-*n* may thus be assigned different channel wavelengths within the L-band and within the C-band. Transceivers or receivers located within the ONUs/ONTs 212-1 to 212-*n* may be configured to receive an optical signal on at least one channel wavelength in the L-band. Transceivers or transmitters located within the ONUs/ONTs 212-1 to 212-*n* may be configured to transmit an optical signal on at least one channel wavelength in the C-band. Other wavelengths and wavelength bands are also within the scope of the system and method described herein.

In the example embodiment, the multiplexing laser array mux assembly 204 in the OLT 110 may generate optical signals at the different respective channel wavelengths in the L-band (e.g., $\lambda_{L1}, \lambda_{L2}, \ldots \lambda_{Ln}$). Each of the lasers in a laser array of the laser array mux assembly 204 may be modulated by a respective RF signal to generate the respective optical signals, and an optical multiplexer (e.g., AWG) combines the optical signals at the different respective channel wavelengths (e.g., $\lambda_{L1}, \lambda_{L2}, \ldots \lambda_{Ln}$), as will be described in greater detail below. The branching point 218 may demultiplex the downstream aggregate WDM optical signal (e.g., $\lambda_{L1}, \lambda_{L2}, \ldots \lambda_{Ln}$) from the OLT 210 for transmission of the separate channel wavelengths to the respective ONUs/ONTs 212-1 to 212-*n*. Alternatively, the branching point 218 may provide the aggregate WDM optical signal to each of the ONUs/ONTs 212-1 to 212-*n* and each of the ONUs/ONTs 212-1 to 212-*n* separates and processes the assigned optical channel wavelength. The individual optical signals may be encrypted to prevent eavesdropping on optical channels not assigned to a particular ONU/ONT.

In the example embodiment, the wavelength-selectable laser array mux assembly 202 in one or more of the ONUs/ONTs 212-1 to 212-*n* may generate an optical signal at a selected one of the channel wavelengths in the C-band (e.g., $\lambda_{C1}, \lambda_{C2}, \ldots, \lambda_{Cn}$). The branching point 218 combines or multiplexes the upstream optical signals from the respective ONUs/ONTs 212-1 to 212-*n* for transmission as an aggregate WDM optical signal over the trunk optical path 214 to the OLT 210.

Although examples of WDM systems are illustrated, laser array mux assemblies, consistent with embodiments described herein, may also be used in other types of optical systems. A wavelength-selectable laser array mux assembly may be used, for example, to scan across a range of wavelengths in spectroscopy applications to analyze different absorption characteristics of a gas.

Figure 3:
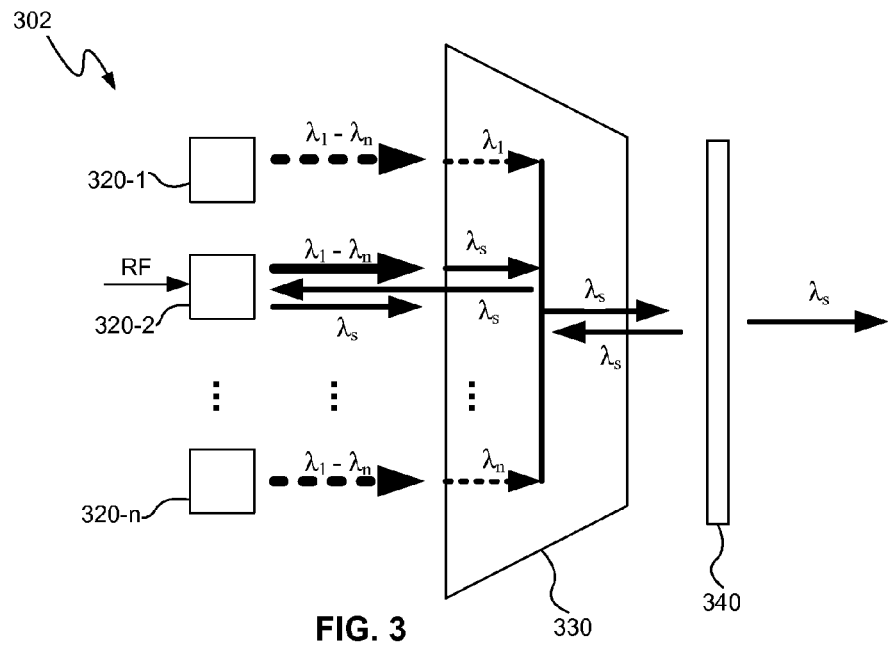
FIG. 3 is a schematic diagram of a wavelength-selectable laser array mux assembly with an external reflector, consistent with an embodiment of the present disclosure.

FIG. 3 illustrates operation of a wavelength-selectable laser array mux assembly 302, consistent with embodiments of the present disclosure, for providing a selected wavelength. The wavelength-selectable laser array mux assembly 302 includes an array of laser emitters 320-1 to 320-*n* optically coupled to respective input ports of an optical multiplexer 330 and a partial reflector 340 coupled to an output port of the optical multiplexer 330. Each of the laser emitters 320-1 to 320-*n* is configured to emit light across a range of wavelengths including the channel wavelengths (e.g., $\lambda_1$ to $\lambda_n$) of an optical communication system. The laser emitters 320-1 to 320-*n* may be, for example, essentially the same laser or gain chips. The light emitted from a selected one of the laser emitters 320-1 to 320-*n* is coupled into the optical multiplexer 330.

The optical multiplexer 330 (e.g., an AWG) filters the emitted light at a different channel wavelength for each input port such that the emitted light from each of the laser emitters 320-1 to 320-*n* passes through the optical multiplexer 330 at a different channel wavelength (e.g., $\lambda_1, \lambda_2, \ldots \lambda_n$). Thus, the different channel wavelengths (e.g., $\lambda_1, \lambda_2, \ldots \lambda_n$) are associated with respective input ports of the optical multiplexer 330 and with respective laser emitters 320-1 to 320-*n* coupled to those input ports. The partial reflector 340 reflects at least a portion of the filtered light back through the optical multiplexer 330 and into a gain region of each of the respective laser emitters 320-1 to 320-*n* such that a lasing cavity is formed between a back reflector of the selected one of the laser emitters 320-1 to 320-*n* and the partial reflector 340.

The wavelength-selectable laser array mux assembly 302 may select a channel wavelength ($\lambda_s$) for transmission by modulating the laser emitter corresponding to that selected channel wavelength ($\lambda_s$) without modulating the other laser emitters. When the selected channel wavelength ($\lambda_s$) is associated with the laser emitter 320-2, for example, the laser emitter 320-2 is modulated with an RF signal and modulated light is emitted from the laser emitter 320-2 without emitting light from the other laser emitters. The emitted modulated light at multiple wavelengths ($\lambda_1$ to $\lambda_n$) is coupled into the respective input port of the optical multiplexer 330 and is filtered at the associated channel wavelength, i.e., the selected channel wavelength ($\lambda_s$). The selected channel wavelength ($\lambda_s$) is then reflected back to the laser emitter 320-2 by the partial reflector 340 such that lasing occurs at the selected channel wavelength ($\lambda_s$). When lasing occurs, the selected channel wavelength ($\lambda_s$) passes through the partial reflector 340, thereby producing an optical signal at the selected channel wavelength ($\lambda_s$).

The wavelength-selectable laser array mux assembly 302 may thus be used in a tunable optical transmitter (e.g., in the ONT/ONUs of a WDM-PON), allowing universal, colorless transmitters capable of changing the selected wavelength without using conventional tunable lasers. By completing the lasing cavity after the optical multiplexer 330 and lasing only at the selected channel wavelength, the tunable transmitters may be more efficient than transmitters including Fabry Perot (FP) lasers that lase across multiple channel wavelengths and then later filter and select a wavelength.

Figure 4:
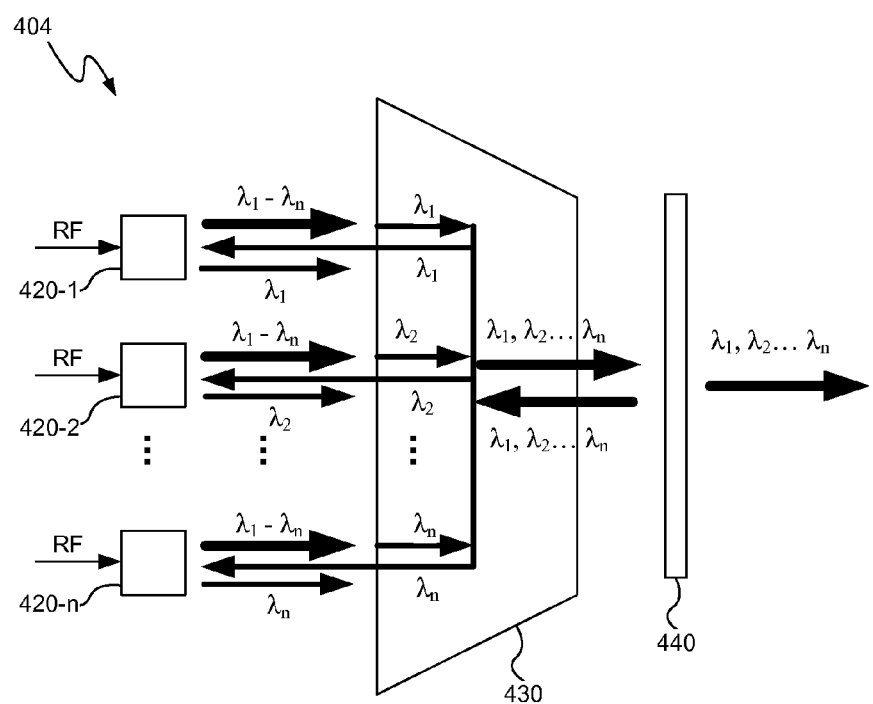
FIG. 4 is a schematic diagram of a multiplexing laser array mux assembly with an external reflector, consistent with an embodiment of the present disclosure.

FIG. 4 illustrates operation of a multiplexing laser array mux assembly 404, consistent with embodiments of the present disclosure, for providing multiplexed wavelengths. The multiplexing laser array mux assembly 404 includes an array of laser emitters 420-1 to 420-*n* optically coupled to respective input ports of an optical multiplexer 430 such that light emitted from each of the laser emitters 420-1 to 420-*n* is coupled into the optical multiplexer 430. Each of the laser emitters 420-1 to 420-*n* is configured to emit light across a range of wavelengths including the channel wavelengths (e.g., $\lambda_1$ to $\lambda_n$) of an optical communication system. The laser emitters 420-1 to 420-n may be, for example, essentially the same laser or gain chips.

The optical multiplexer 430 (e.g., an AWG) filters the emitted light at a different channel wavelength for each input port such that the emitted light from each of the laser emitters 420-1 to 420-n passes through the optical multiplexer 430 at a different channel wavelength (e.g., $\lambda_1$, $\lambda_2, \ldots \lambda_n$). Thus, the different channel wavelengths (e.g., $\lambda_1$, $\lambda_2, \ldots \lambda_n$) are associated with respective input ports of the optical multiplexer 430 and with respective laser emitters 420-1 to 420-n coupled to those input ports. A partial reflector 440 located at an output port of the optical multiplexer 430 reflects at least a portion of the filtered light back through the optical multiplexer 330 and into gain regions of the respective laser emitters 420-1 to 420-n such that lasing cavities are formed between the back reflectors of the laser emitters 420-1 to 420-n and the partial reflector 440.

The multiplexing laser array mux assembly 404 provides multiplexed channel wavelengths by modulating each of the laser emitters 420-1 to 420-n. The emitted modulated light from each of the laser emitters 420-1 to 420-n at the range of channel wavelengths (e.g., $\lambda_1$ to $\lambda_n$) is coupled into the respective input ports of the optical multiplexer 430 and is filtered at the associated channel wavelengths ($\lambda_1, \lambda_2 \ldots \lambda_n$). The filtered channel wavelengths ($\lambda_1, \lambda_2 \ldots \lambda_n$) are combined in the optical multiplexer 430 and then reflected back through the optical multiplexer 430 by the partial reflector 440 such that the associated channel wavelengths ($\lambda_1, \lambda_2 \ldots \lambda_n$) are coupled back into gain regions of the respective laser emitters 420-1 to 420-n. Thus, lasing cavities are formed between the back reflectors of the respective laser emitters 420-1 to 420-n and the partial reflector 440 and lasing occurs at each of the associated channel wavelengths ($\lambda_1, \lambda_2 \ldots \lambda_n$). When lasing occurs, the combined channel wavelengths ($\lambda_1, \lambda_2 \ldots \lambda_n$) pass through the partial reflector 440, thereby producing a WDM optical signal.

Figure 5:
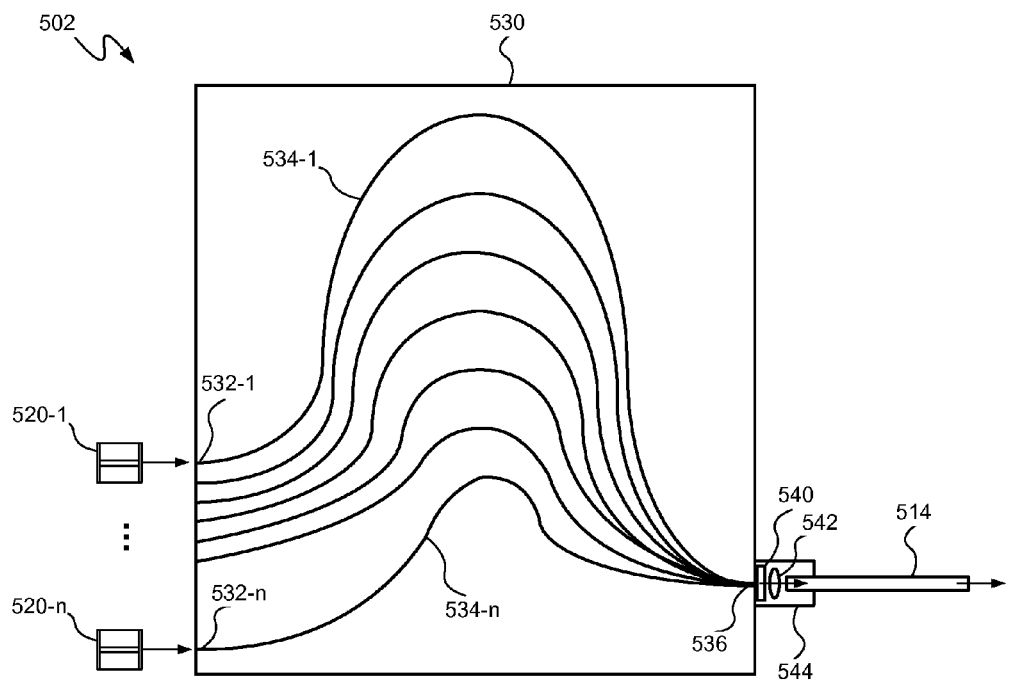
FIG. 5 is a schematic diagram of a laser array mux assembly using an arrayed waveguide grating (AWG) with an external reflector located after the AWG, consistent with an embodiment of the present disclosure.
Figure 6:
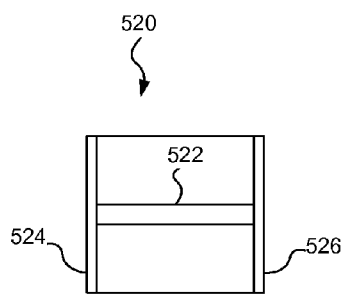
FIG. 6 is a schematic diagram of a gain chip that may be used in the laser array mux assembly.
Figure 7:
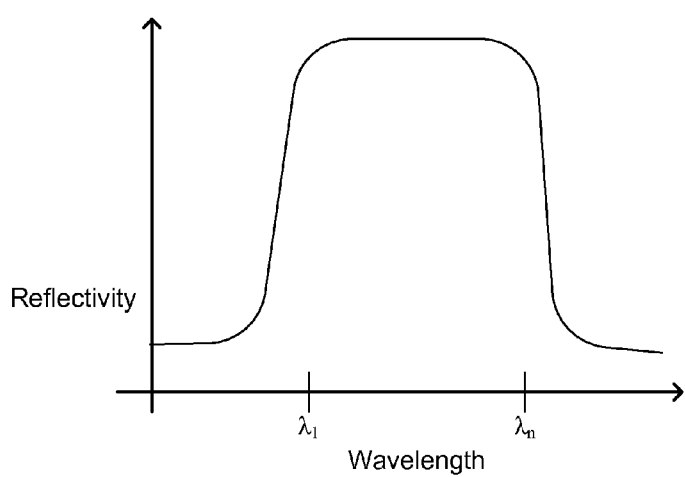
FIG. 7 illustrates the reflectivity characteristics of a fiber Bragg grating that may be used as the partial reflector in the laser array mux assembly.

Referring to FIGS. 5-7, an embodiment of a laser array mux assembly 502 is shown and described in greater detail. The laser array mux assembly 502 includes an array of laser emitters 520-1 to 520-n coupled to input ports 532-1 to 532-n of an arrayed waveguide grating (AWG) 530. The array of laser emitters 520-1 to 520-n may be coupled to the input ports 532-1 to 532-n, for example, using a microlens array or using an optically matched laser array coupling assembly, such as a fiber tip array, as disclosed in greater detail in U.S. patent application Ser. No. 13/357,142 entitled OPTICALLY MATCHED LASER ARRAY COUPLING ASSEMBLY FOR COUPLING LASER ARRAY TO ARRAYED WAVEGUIDE GRATING, which is fully incorporated herein by reference.

As shown in FIG. 6, each laser emitter 520 includes a gain region 522 that generates light across the range of wavelengths and amplifies the reflected light at the associated channel wavelength to provide the gain that results in lasing when the gain exceeds the cavity losses. This embodiment of the laser emitter 520 also includes a back reflector 524 on a back side and an anti-reflective coating 526 on an opposite side coupled to the AWG 530. The back reflector 524 reflects light (e.g., at the channel wavelength) from the laser emitter 520 and the anti-reflective coating 526 allows light to pass into and out of the gain region 522 of the laser emitter 520.

Each laser emitter 520 may include multiple quantum-well active regions or other gain media capable of emitting a spectrum of light across a range of wavelengths and capable of amplifying light reflected back into the gain media. The laser emitter 520 may be, for example, a laser or gain chip such as a semiconductor or diode laser (e.g., Fabry-Perot (FP) diode laser). The back reflector 524 may be highly reflective (e.g., at least 80% reflective) and may include a cleaved facet on a laser or gain chip, a reflective coating on the chip, or a distributed Bragg reflector (DBR) on the gain chip or separate from the gain chip. The anti-reflective coating 526 may have a reflectivity as small as possible (e.g., less than 1% reflective).

The AWG 530 includes an array of waveguides 534-1 to 534-n coupled to the input ports 522 and an output port 536. The AWG 530 may include existing AWGs that provide the desired channel wavelengths on the respective waveguides 534-1 to 534-n, effectively filtering the light passing through the AWG 530. The AWG 530 may be a dense WDM (DWDM) AWG with sixteen AWG inputs and waveguides for 16 channels, although other AWG configurations with other numbers of channels are within the scope of the present disclosure. Although the example embodiment shows an AWG, a laser array mux assembly may also include other types of optical multiplexers capable of filtering light at different channel wavelengths associated with different respective input ports of the optical multiplexer.

A partial reflector 540 is optically coupled to the output port 536 of the AWG 530 and an optical fiber 514 is optically coupled to the partial reflector 540, for example, using a lens 542. The partial reflector 540 has partial reflectivity across the channel wavelengths ($\lambda_1$ to $\lambda_n$), as shown in FIG. 7, which is sufficient to achieve lasing at those wavelengths. When the laser mux assembly 502 is used in an OLT of a WDM-PON as shown in FIG. 2, for example, the partial reflector 540 may provide about 50% reflectivity across wavelengths in the L band. The partial reflector 540 may include, for example, a partially reflective coating, a thin film reflector, or a fiber grating (e.g., a 50% fiber Bragg grating). When the partial reflector 540 is a fiber grating, a single port V-groove block 544 may be used to align the fiber grating with the AWG output port 536 and the optical fiber 514.

The partial reflector 540 thus acts as an exit mirror that completes the lasing cavity. Because the lasing cavity is completed after the multiplexer 530, the reflected light is filtered by the multiplexer 430 and only the reflected light at the filtered channel wavelengths is reflected back to the gain regions in the respective transmitters 520-1 to 520-n. Thus, lasing occurs only at one or more of the channel wavelengths.

Accordingly, a laser mux assembly, consistent with embodiments of the present disclosure, may be used advantageously in optical transmitters that transmit multiplexed optical signals at a plurality of channel wavelengths and/or in tunable optical transmitters that transmit optical signals at a selected channel wavelength. Using an optical multiplexer, such as an AWG, to lock in the one or more channel wavelengths, for example, avoids using complicated external wavelength locking and controls.

Consistent with an embodiment, a laser array mux assembly includes an array of laser emitters, each of the laser emitters including a gain region for emitting light across a range of wavelengths including a plurality of channel wavelengths and a back reflector for reflecting light from the laser emitter. The laser array mux assembly also includes an optical multiplexer including a plurality of input ports coupled to the laser emitters, respectively, and an output port. The optical multiplexer is configured to filter light received on each of the input ports at different respective channel wavelengths for each of the input ports and to provide the filtered light to the output port. The laser array mux assembly also includes a partial reflector coupled to the output port of the optical multiplexer. The partial reflector is configured to reflect at least a portion of the filtered light back to the gain region in the respective laser emitters such that at least one lasing cavity is formed between the back reflector of at least one of the laser emitters and the partial reflector and lasing occurs at the channel wavelength(s) reflected back to the gain region of the respective laser emitters.

Consistent with another embodiment, a wavelength division multiplexed (WDM) system includes a plurality of terminals associated with different respective channel wavelengths and configured to transmit optical signals on the different respective channel wavelengths. At least one of the plurality of terminals includes at least a tunable optical transmitter configured to be tuned to a respective one of the channel wavelengths. The tunable optical transmitter includes a wavelength-selectable laser array mux assembly configured to transmit an optical signal at the selected one of the channel wavelengths. The laser array mux assembly includes an array of laser emitters, each of the laser emitters including a gain region for emitting light across a range of wavelengths including the channel wavelengths and a back reflector for reflecting light from the laser emitters. The laser array mux assembly also includes an optical multiplexer including a plurality of input ports coupled to the laser emitters, respectively, and an output port. The optical multiplexer is configured to filter light received on each of the input ports, respectively, at the different channel wavelengths and to provide the filtered light to the output port. The laser array mux assembly also includes a partial reflector coupled to the output port of the optical multiplexer. The partial reflector is configured to reflect at least a portion of the filtered light back to the gain regions in the respective laser emitters such that a lasing cavity is formed between the back reflector of a selected one of the laser emitters and the partial reflector and lasing occurs at the selected channel wavelength reflected back to the gain region of the selected one of the laser emitters.

Consistent with a further embodiment, a wavelength division multiplexed (WDM) system includes a plurality of terminals configured to transmit and receive optical signals on multiple channel wavelengths. At least one of the plurality of terminals includes a multiplexing laser array mux assembly configured to transmit a WDM optical signal at the plurality of channel wavelengths. The laser array mux assembly includes an array of laser emitters, each of the laser emitters including a gain region for emitting light across a range of wavelengths including the channel wavelengths and a back reflector for reflecting light from the laser emitters. The laser array mux assembly also includes an optical multiplexer including a plurality of input ports coupled to the laser emitters, respectively, and an output port. The optical multiplexer is configured to filter light received on each of the input ports, respectively, at the different channel wavelengths and to provide the filtered light to the output port. The laser array mux assembly also includes a partial reflector coupled to the output port of the optical multiplexer. The partial reflector is configured to reflect at least a portion of the filtered light back to the gain regions in the respective laser emitters such that lasing cavities are formed between the back reflector of each of the laser emitters and the partial reflector and lasing occurs at each of the channel wavelengths reflected back to the respective gain regions of the respective laser emitters.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A laser array mux assembly comprising:
  an array of laser emitters, each of the laser emitters including a gain region for emitting light across a range of wavelengths including a plurality of channel wavelengths and a back reflector for reflecting light from the laser emitters, wherein the back reflector of each of the laser emitters is highly reflective, and wherein each of the laser emitters includes an anti-reflective coating on an opposite side, the anti-reflective coating providing a reflectivity of less than 1%, and wherein each of the laser emitters is essentially the same and is configured to emit light across the same plurality of channel wavelengths;
  an optical multiplexer including a plurality of input ports coupled to the laser emitters, respectively, and an output port, wherein the optical multiplexer is an arrayed waveguide grating (AWG) configured to filter light received on each of the input ports at different respective channel wavelengths for each of the input ports and to provide the filtered light to the output port; and
  a partial reflector coupled directly to the output port of the optical multiplexer, the partial reflector being partially reflective across the channel wavelengths and configured to reflect at least a portion of the filtered light back to the gain region in the respective laser emitters such that at least one lasing cavity is completed after the optical multiplexer and formed between the back reflector of at least one of the laser emitters and the partial reflector and lasing occurs at the channel wavelength(s) reflected back to the gain region of the respective laser emitters.

2. The laser array mux assembly of claim 1 wherein each of the laser emitters includes a semiconductor diode gain chip.

3. The laser array mux assembly of claim 1 wherein the partial reflector is a fiber Bragg grating.

4. The laser array mux assembly of claim 1 wherein the partial reflector is a thin film coating.

5. The laser array mux assembly of claim 1 wherein the array of laser emitters is configured to emit light from a selected one of the laser emitters such that lasing occurs at a corresponding selected channel wavelength.

6. The laser array mux assembly of claim 1 wherein the array of laser emitters is configured to emit light from each of the laser emitters such that lasing occurs at a plurality of channel wavelengths.

7. The laser array mux assembly of claim 1 wherein the plurality of wavelengths include wavelengths in the L-band.

8. The laser array mux assembly of claim 1 wherein the plurality of wavelengths include wavelengths in the C-band.

9. A wavelength division multiplexed (WDM) system comprising:
  a plurality of terminals associated with different respective channel wavelengths each of the plurality of terminals including a universal, colorless tunable optical transmitter configured to transmit optical signals within a range of wavelengths including the channel wavelengths and configured to be tuned to a respective one of the channel wavelengths, the tunable optical transmitter comprising a wavelength-selectable laser array mux assembly configured to transmit an optical signal at the selected one of the channel wavelengths, the laser array mux assembly comprising:

an array of laser emitters, each of the laser emitters including a gain region for emitting light across a range of wavelengths including the channel wavelengths and a back reflector for reflecting light from the laser emitters, wherein the back reflector of each of the laser emitters is highly reflective, and wherein each of the laser emitters includes an anti-reflective coating on an opposite side, the anti-reflective coating providing a reflectivity of less than 1%, wherein each of the laser emitters is essentially the same and is configured to emit light across the same plurality of channel wavelengths, and wherein a selected one of the laser emitters emits light at the selected one of the channel wavelengths without emitting light from others of the laser emitters;

an optical multiplexer including a plurality of input ports coupled to the laser emitters, respectively, and an output port, wherein the optical multiplexer is an arrayed waveguide grating (AWG) configured to filter light received on each of the input ports, respectively, at the different channel wavelengths and to provide the filtered light to the output port; and a partial reflector coupled directly to the output port of the optical multiplexer, the partial reflector being partially reflective across the channel wavelengths and configured to reflect at least a portion of the filtered light back to the gain regions in the respective laser emitters such that a lasing cavity is completed after the optical multiplexer and formed between the back reflector of a selected one of the laser emitters and the partial reflector and lasing occurs at the selected channel wavelength reflected back to the gain region of the selected one of the laser emitters.

10. The WDM system of claim 9 wherein the plurality of terminals include optical networking terminals (ONTs) in a WDM passive optical network (PON).

11. The WDM system of claim 9 further comprising:
at least one optical line terminal (OLT) configured to receive aggregate WDM optical signals including the channel wavelengths;
at least one branching point coupled between the OLT and the plurality of terminals, the branching point being configured to combine the optical signals at the channel wavelengths; and
a trunk optical path coupling the OLT and the branching point.

12. The WDM system of claim 9 wherein the channel wavelengths include wavelengths in the C-band.

13. The WDM system of claim 9 wherein each of the laser emitters includes a semiconductor diode gain chip.

14. The WDM system of claim 9 wherein the partial reflector is a fiber Bragg grating.

15. The WDM system of claim 9 wherein the partial reflector is a thin film coating.

16. A wavelength division multiplexed (WDM) system comprising:

a plurality of terminals configured to transmit and receive optical signals on multiple channel wavelengths, at least one of the plurality of terminals comprising a multiplexing laser array mux assembly configured to transmit a WDM optical signal at the plurality of channel wavelengths, the laser array mux assembly comprising:

an array of laser emitters, each of the laser emitters including a gain region for emitting light across a range of wavelengths including the channel wavelengths and a back reflector for reflecting light from the laser emitters, wherein the back reflector of each of the laser emitters is highly reflective, and wherein each of the laser emitters includes an anti-reflective coating on an opposite side, the anti-reflective coating providing a reflectivity of less than 1%, and wherein each of the lasers emitters is essentially the same and is configured to emit light across the same plurality of channel wavelengths;

an optical multiplexer including a plurality of input ports coupled to the laser emitters, respectively, and an output port, wherein the optical multiplexer is an arrayed waveguide grating (AWG) configured to filter light received on each of the input ports, respectively, at the different channel wavelengths and to provide the filtered light to the output port; and a partial reflector directly coupled to the output port of the optical multiplexer, the partial reflector being partially reflective across the channel wavelengths and configured to reflect at least a portion of the filtered light back to the gain regions in the respective laser emitters such that lasing cavities are completed after the optical multiplexer and formed between the back reflectors of each of the laser emitters and the partial reflector and lasing occurs at each of the channel wavelengths reflected back to the respective gain regions of the respective laser emitters.

17. The WDM system of claim 16 wherein the at least one of the terminals includes an optical line terminal (OLT) in a WDM passive optical network (PON) and configured to transmit the WDM optical signal including the channel wavelengths, and wherein others of the plurality of terminals include optical networking terminals (ONTs) configured to receive optical signals at respective ones of the channel wavelengths in the WDM-PON.

18. The WDM system of claim 16 wherein others of the plurality of terminals are associated with different channel wavelengths, and further comprising:
at least one branching point coupled between the at least one of the plurality of terminals and others of the plurality of terminals, the branching point being configured to separate the WDM optical signal into optical signals at the channel wavelengths; and
a trunk optical path coupling the at least one of the plurality of terminals and the branching point.

19. The WDM system of claim 16 wherein the optical multiplexer is an arrayed waveguide grating (AWG).

20. The WDM system of claim 16 wherein the channel wavelengths include wavelengths in the C-band.

* * * * *